United States Patent [19]

Meguerdichian

[11] Patent Number: 4,623,983
[45] Date of Patent: Nov. 18, 1986

[54] DIGITAL SIGNAL ANALYZER WITH ANALOG DISPLAY

[75] Inventor: Gary M. Meguerdichian, Waterbury, Conn.

[73] Assignee: Otis Elevator Company, Farmington, Conn.

[21] Appl. No.: 468,437

[22] Filed: Feb. 22, 1983

[51] Int. Cl.[4] .................. G11C 19/00; H04Q 3/06; G06F 15/20
[52] U.S. Cl. ........................ 364/900; 340/347 DA; 340/347 DD
[58] Field of Search .............. 324/73 R; 371/15–29; 340/347 DA, 347 DD; 364/900 MS File

[56] References Cited

U.S. PATENT DOCUMENTS

| | | | |
|---|---|---|---|
| 3,872,465 | 3/1975 | Loofbourrow | 340/347 DA |
| 3,913,093 | 10/1975 | De Vincentiis et al. | 340/347 DD |
| 4,002,973 | 1/1977 | Wiesendanger et al. | 324/73 R |
| 4,383,304 | 5/1983 | Hirashima | 364/900 X |
| 4,472,788 | 9/1984 | Yamazaki | 364/900 |

Primary Examiner—Errol A. Krass
Assistant Examiner—Edward R. Cosimano

[57] ABSTRACT

A digital signal having N bits is converted to a signal having Y of the N bits, according to their order of significance in the N-bit signal. Y is less than N. The Y-bit signal is converted to an analog voltage. The analog voltage provides an indication of information represented by the selected Y bits in the N-bit signal.

4 Claims, 1 Drawing Figure

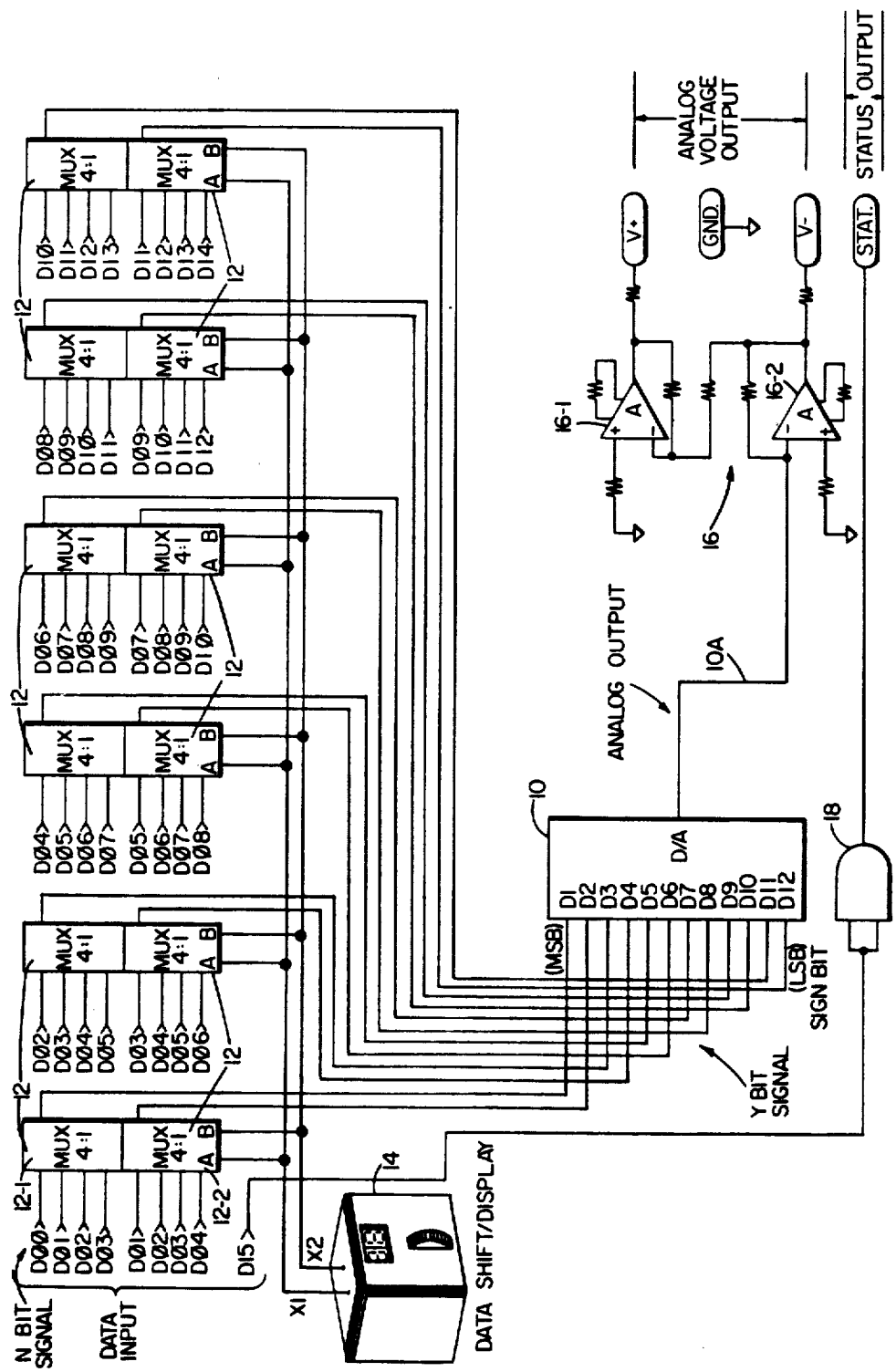

(# 4,623,983)

DIGITAL SIGNAL ANALYZER WITH ANALOG DISPLAY

TECHNICAL FIELD

This invention is concerned with the field of diagnostic testing of computer-based systems, for example, a microprocessor-based elevator.

BACKGROUND ART

Logic analyzers are well-known devices that are connected to the digital bus of a system to read addressed information on the bus and provide a digital indication of either or both the address and the information associated with the address. For instance, in a digital system, a system using a microprocessor, various diagnostic system tests can be performed with a logic analyzer intercepting the flow of information within the system.

But generally speaking, currently available logic analyzers are expensive, especially those that use an oscilloscope to display the encoded information. With these, the user must convert the displayed code to know what the encoded data is. Though, sometimes in more expensive analyzers the code is converted and displayed on the screen.

But, in many test applications such sophisticated equipment is not really appropriate, and not simply because of cost, but also because the equipment does not provide the most useful—practical—information for "diagnostic" testing. The field of elevator maintenance offers good examples. In a microprocessor-controlled elevator, encoded digital information may be used very effectively for diagnostic testing, for instance, actual and theoretical operational tests. In some tests, the actual information on car location and car velocity can be used to create waveforms or graphs showing actual car motion. This would yield a very effective diagnostic field test. State-of-the-art logic analyzers, however, could not be used to perform this type of test—at least not conveniently or inexpensively.

Sometimes, for some tests only a small portion of that digital information is needed. The status of a single device, for example, a relay in an elevator, may be indicated in a digital word consisting simply of a device identifying address and status bit (indicating the status, e.g. ON/OFF, of the device). In performing a diagnostic test, a service technician may simply need to see a light or meter go on or off, to observe the operation of the device.

In short, there, the need exists for a small, compact, inexpensive analog logic analyzer.

SUMMARY OF THE INVENTION

Among objects of the present invention is providing a low cost logic analyzer, one that has one or more analog outputs that provide various types of analog indications of the changes in selected digitally addressable information, and one that is inexpensive.

According to one aspect of the present invention, digital addresses and corresponding words are applied to an address decoder (logic analyzer) that receives an addressed word on the bus and provides an output comprising the digital word that manifests the information with the address. This word, containing, for example, N bits, is applied to a converter which is controlled to provide a digital word, comprising something less than N bits, by selecting, in an ordered sequence, particular bits in the N-bit word, so as to delete the least significant bits on these that are not informative. For example, a 16-bit data word (N=16) has bits D0–DN-1; it can be reduced to a 12-bit word comprised of bits to D04–D15 or D00–D11.

According to another aspect of the invention, this smaller word, having less than N bits, is applied to a D-A converter that provides an analog signal.

According to another aspect of the invention, one of these bits of information may be, depending upon selection made in the bit reduction process, applied to an on/off circuit to provide a high or low voltage, as a function of the status of the bit, and this can power a visual or audible indicator.

BRIEF DESCRIPTION OF DRAWING

The drawing is a block diagram of a diagnostic device for providing, according to the invention, two analog indications of digital information carried on a multibit BDS.

BEST MODE FOR CARRYING OUT THE INVENTION

In the drawing, an encoded digital signal D0-DN, the DATA INPUT signal, is the information that is used to provide an analog signal. The signal may be hex coded, using 15 bits; that is, N is 15. The signal D0–DN comprises bits D00–D15.

Using the combination in the drawing, the N-bit DATA INPUT is converted to a Y-bit encoded digital signal, and in this particular embodiment Y is 12. The Y-bit digital signal is applied to a D-A converter 10 which provides the analog signal whose magnitude represents the magnitude of the Y-bit signal, hence, the encoded magnitude of Y bits in the DATA INPUT (DI) signal, e.g. D1–D12.

The DI signal is applied to a conversion circuit, consisting of Y 4:1 demultiplexers (MUX) 12, and in this example, Y is 12. Each demultiplexer receives (N-Y) four bits in the DATA INPUT signal, or in this example 4 bits. For example, the demultiplexers 12-1 receive the bits D00–D03; and a second demultiplexer 12-2 receives bits D01–D04. The relationship between these two and the other demultiplexers is that the second most significant bit in the first demultiplexer is the first most significant bit in the second demultiplexer. D01 input to MUX 12-1 is the first (MS) bit on MUX 12-2.

But, each MUX's output comprises just one of the four bits in its input, and the selected bit is determined by a demultiplexer selection signal comprising bits X1, X2, that is applied to the demultiplexer. A data shift/display control (e.g. a thumb-wheel switch) is operated to provide the bits X1, X2 and is encoded to identify one of the four bits. The data shift/display device output, the signal comprising X1, X2, is applied simultaneously to each of the demultiplexers, and, as a result, each selects the same one of the four input bits applied. Stated another way, each demultiplexer will produce, as its output, a bit which, within its own group, has the same "significance". Assume, for example, that the output from the data shift display is 01 (X1=0, X2=1). This identifies the "second" bit, bit 2. Then the bits that make up the Y-bit signal (all the multiplexer outputs) will be made up of bits D01–D12.

In producing this 12-bit signal, a signal is applied to the D-A converter 10, but four bits in the DI signal have been deleted; but which ones depends on the selection signal. This process may be visually imagined, as manually positioning a 12-bit wide "window" across the 16-bit word. Relevant data, e.g. twelve consecutive bits in the word may be selected for providing an analog signal at the D-A converter.

The analog output of the D-A on the line 10A is the analog equivalent of the 12 bits in the data input, and it is supplied to a differential amplifier circuit 16-1, 16-2 in a straightforward, differential (floating) drive configuration. A differential ANALOG VOLTAGE OUTPUT appears between their outputs V+ and V− through drive resistors, and it can be used to drive an analog device, for instance, a strip chart recorder or a volt meter—for that matter, any other visual display, even an oscilloscope.

In this particular embodiment, one of the data input signal bits is separately used to provide a "status" output signal, bit D15. It is applied to a buffer device 18. If, for example, the data bit is high, the buffer device output is "on", is high and and powers a light or a bell to provide a visual indication of the status of a simple device, such as a relay or switch in a system. In fact, the incoming data input signal may consist only of the bit D15, and the status of which (high or low) indicates whether the device is or is not actuated.

From this, it can be seen that using an inexpensive 12-bit D-A converter (a 16-bit is very expensive), the device shown in the drawing provides a very simple, portable tool for performing an analog diagnostic test on a data input signal in hex decimal code, much like a VOM. An important characteristic is that, though bits are deleted, the deletion is selectable, and the bits that make up the 12-bit digital word that is produced by the conversion process maintain their relative levels of significance.

Hence, with a simple manual selection process, it is possible to delete certain bits in the hex decimal data input signal that are less significant or contain unnecessary information. Using the device, a service technician can delete extraneous digital information in the hex decimal data input signal in performing a diagnostic test, and he can, as a direct result, perform fine or course resolution tests, depending on the bits he selects to form the 12-bit word and test requirements.

To one skilled in the art, this description will suggest various modifications and alterations to the described embodiment of the invention without departing from the true scope and spirit of the invention embraced therein as described in the following claims.

I claim:

1. An apparatus for performing an analog test on an encoded digital signal having D0–DN bits, N being an integer, comprising:
 a digital/analog converter for providing an analog output signal in response to a Y-bit encoded digital signal, Y being an integer less than N;
 means for receiving said N-bit digital signal and providing said Y-bit signal, said means comprising Y demultiplexers, each one receiving a bit group comprising N-Y[+1] bits of said N-bit signal and each one providing a single output that comprises one of the N-Y bits in response to a selection signal that identifies the one bit, the most significant bit in each one group of signals is the next most significant in a second group, said selection signal identifying bits of the same significance in each group, and the relative order of significance in the Y-bit signal is the same as the relative order in the N-bit signal; and
 means for providing said selection signal in response to a manually entered command to select a certain group of Y bits in the N-bit signal.

2. The apparatus of claim 1, wherein Y is 12 and N is 16.

3. The apparatus of claim 1, comprising means for providing in response to the shift in the binary level of one of said N bits in said N-bit signal, a signal to activate a visual indicator.

4. A method for testing a system having N-bit information, comprising the steps:
 (a) connecting a decoder to the system for receiving the N-bit information, the decoder comprising means for extracting one or more of the bits in the N-bit information in response to a code identifying the bits by their order of significance;
 (b) manually entering a code on the decoder identifying a Y number of bits to cause the decoder to provide a Y-bit signal by selecting Y bits in said N-bit signal according to their order of significance, Y being less than N; and
 (c) converting said Y-bit signal to an analog signal.

* * * * *